US007675485B2

(12) United States Patent
Steer

(10) Patent No.: US 7,675,485 B2
(45) Date of Patent: Mar. 9, 2010

(54) ELECTROLUMINESCENT DISPLAY DEVICES

(75) Inventor: William A. Steer, Stanmore (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 1159 days.

(21) Appl. No.: 10/530,269

(22) PCT Filed: Sep. 15, 2003

(86) PCT No.: PCT/IB03/04136

§ 371 (c)(1),
(2), (4) Date: Apr. 5, 2005

(87) PCT Pub. No.: WO2004/034365

PCT Pub. Date: Apr. 22, 2004

(65) Prior Publication Data

US 2006/0022204 A1 Feb. 2, 2006

(30) Foreign Application Priority Data

Oct. 8, 2002 (GB) ................................ 0223305.4

(51) Int. Cl.
*H01L 33/00* (2006.01)
*H01L 21/00* (2006.01)

(52) U.S. Cl. ......................... 345/76; 315/169.3; 257/79

(58) Field of Classification Search ................... 345/76; 315/169.3; 257/79
See application file for complete search history.

(56) References Cited

U.S. PATENT DOCUMENTS

| | | | | |
|---|---|---|---|---|
| 6,359,605 | B1 * | 3/2002 | Knapp et al. | 345/76 |
| 6,441,560 | B1 * | 8/2002 | Hunter | 315/169.1 |
| 6,542,138 | B1 * | 4/2003 | Shannon et al. | 345/76 |
| 2001/0024186 | A1 * | 9/2001 | Kane et al. | 345/98 |
| 2002/0126073 | A1 * | 9/2002 | Knapp et al. | 345/76 |
| 2003/0020413 | A1 * | 1/2003 | Oomura | 315/169.3 |
| 2004/0036664 | A1 * | 2/2004 | Miyazawa | 345/76 |
| 2004/0066357 | A1 * | 4/2004 | Kawasaki | 345/76 |

FOREIGN PATENT DOCUMENTS

| | | | |
|---|---|---|---|
| EP | 1221686 A2 | | 7/2002 |
| EP | 1221686 A3 | | 3/2003 |
| GB | 1221686 | * | 3/2002 |

* cited by examiner

*Primary Examiner*—Bipin Shalwala
*Assistant Examiner*—Afroza Y Chowdhury

(57) ABSTRACT

An active matrix electroluminescent display device comprises an array of display pixels. In each pixel, a first switch connects power from a power supply line to the display element and a second switch routes current from a current-measurement supply line to the display element. The gate voltage applied to a drive transistor is controlled by a feedback system, such that control voltage is controlled in closed loop manner to achieve the desired current. The control voltage can then be used for subsequent addressing of the pixel.

10 Claims, 2 Drawing Sheets

ELECTROLUMINESCENT DISPLAY DEVICES

This invention relates to electroluminescent display devices, particularly active matrix display devices having thin film switching transistors associated with each pixel.

Matrix display devices employing electroluminescent, light-emitting, display elements are well known. The display elements may comprise organic thin film electroluminescent elements, for example using polymer materials, or else light emitting diodes (LEDs) using traditional III-V semiconductor compounds. Recent developments in organic electroluminescent materials, particularly polymer materials, have demonstrated their ability to be used practically for video display devices. These materials typically comprise one or more layers of a semiconducting conjugated polymer sandwiched between a pair of electrodes, one of which is transparent and the other of which is of a material suitable for injecting holes or electrons into the polymer layer.

The polymer material can be fabricated using a CVD process, or simply by a spin coating technique using a solution of a soluble conjugated polymer. Ink-jet printing may also be used. Organic electroluminescent materials exhibit diode-like I-V properties, so that they are capable of providing both a display function and a switching function, and can therefore be used in passive type displays. Alternatively, these materials may be used for active matrix display devices, with each pixel comprising a display element and a switching device for controlling the current through the display element.

Display devices of this type have current-driven display elements, so that a conventional, analogue drive scheme involves supplying a controllable current to the display element. It is known to provide a current source transistor as part of the pixel configuration, with the gate voltage supplied to the current source transistor determining the current through the display element. A storage capacitor holds the gate voltage after the addressing phase.

FIG. 1 shows a known pixel circuit for an active matrix addressed electroluminescent display device. The display device comprises a panel having a row and column matrix array of regularly-spaced pixels, denoted by the blocks 1 and comprising electroluminescent display elements 2 together with associated switching means, located at the intersections between crossing sets of row (selection) and column (data) address conductors 4 and 6. Only a few pixels are shown in the Figure for simplicity. In practice, there may be several hundred rows and columns of pixels. The pixels 1 are addressed via the sets of row and column address conductors by a peripheral drive circuit comprising a row, scanning, driver circuit 8 and a column, data, driver circuit 9 connected to the ends of the respective sets of conductors.

The electroluminescent display element 2 comprises an organic light emitting diode, represented here as a diode element (LED) and comprising a pair of electrodes between which one or more active layers of organic electroluminescent material is sandwiched. The display elements of the array are carried together with the associated active matrix circuitry on one side of an insulating support. Either the cathodes or the anodes of the display elements are formed of transparent conductive material. The support is of transparent material such as glass and the electrodes of the display elements 2 closest to the substrate may consist of a transparent conductive material such as ITO so that light generated by the electroluminescent layer is transmitted through these electrodes and the support so as to be visible to a viewer at the other side of the support. Typically, the thickness of the organic electroluminescent material layer is between 100 nm and 200 nm. Typical examples of suitable organic electroluminescent materials which can be used for the elements 2 are known and described in EP-A-0 717446. Conjugated polymer materials as described in WO96/36959 can also be used.

FIG. 2 shows in simplified schematic form a known pixel and drive circuitry arrangement for providing voltage-programmed operation. Each pixel 1 comprises the EL display element 2 and associated driver circuitry. The driver circuitry has an address transistor 16 which is turned on by a row address pulse on the row conductor 4. When the address transistor 16 is turned on, a voltage on the column conductor 6 can pass to the remainder of the pixel. In particular, the address transistor 16 supplies the column conductor voltage to a current source 20, which comprises a drive transistor 22 and a storage capacitor 24. The column voltage is provided to the gate of the drive transistor 22, and the gate is held at this voltage by the storage capacitor 24 even after the row address pulse has ended. The drive transistor 22 draws a current from the power supply line 26.

The drive transistor 22 in this circuit is implemented as a PMOS TFT, so that the storage capacitor 24 holds the gate-source voltage fixed. This results in a fixed source-drain current through the transistor, which therefore provides the desired current source operation of the pixel.

The above basic pixel circuit is a voltage-programmed pixel, and there are also current-programmed pixels which sample a drive current. However, all pixel configurations require current to be supplied to each pixel.

One problem with voltage programmed pixels, particularly using polysilicon thin film transistors, is that different transistor characteristics across the substrate (particularly the threshold voltage) give rise to different relationships between the gate voltage and the source-drain current, and artefacts in the displayed image result.

It has been recognised that a current-programmed pixel can reduce or eliminate the effect of transistor variations across the substrate. For example, a current-programmed pixel can use a current mirror to sample the gate-source voltage on a sampling transistor through which the desired pixel drive current is driven. The sampled gate-source voltage is used to address the drive transistor. This partly mitigates the problem of uniformity of devices, as the sampling transistor and drive transistor are adjacent each other over the substrate and can be more accurately matched to each other. Another current sampling circuit uses the same transistor for the sampling and driving, so that no transistor matching is required, although additional transistors and address lines are required.

A further problem with LED displays arises from the significant currents drawn by the pixels. The displays are typically backward-emitting, through the substrate carrying the active matrix circuitry. This is the preferred arrangement because the desired cathode material of the EL display element is opaque, so that the emission is from the anode side of the EL diode, and furthermore it is not desirable to place this preferred cathode material against the active matrix circuitry. Metal row conductors are formed to define power supply lines, and for these backward emitting displays they need to occupy the space between display areas, as they are opaque. For example, in a 12.5 cm (diagonal) display, which is suitable for portable products, the row conductor may be approximately 11 cm long and 20 μm wide. For a typical metal sheet resistance of 0.2Ω/square, this gives a line resistance for a metal row conductor of 1.1 kΩ. A bright pixel may draw around 8 μA, and the current drawn is distributed along the row. The significant row conductor resistance gives rise to voltage drops is along the row conductors, and these voltage variations along the power supply line alter the gate-source voltage on the drive transistors, and thereby affect the brightness of the display. Furthermore, as the currents drawn by the pixels in the row are image-dependent, it is difficult to correct the pixel drive levels by data correction techniques, and the distortion is essentially a cross talk between pixels in different columns.

The voltage drops can be reduced by a factor of 4 by drawing current from both ends of the row, and improvements in efficiency of the EL materials can also reduce the current drawn. Nevertheless significant voltage drops are still present. These voltage drops also give rise to performance limitations in current mirror pixel circuits, and thin film transistors are inherently non-ideal current source devices (the output current will in fact depend on both the source and drain voltages rather than only on the gate-source voltage).

According to the invention, there is provided an active matrix electroluminescent display device comprising an array of display pixels, each pixel comprising:

an electroluminescent (EL) display element and a drive transistor for driving a current through the display element;

a first switch (30) enabling power from a power supply line (26) to be supplied to the display element;

a second switch for routing current from a current-measurement supply line to the display element, the first and second switches being operated in complementary manner; and a control line for controlling the gate voltage applied to the drive transistor, wherein a feedback system is provided between the current-measurement supply line and the control line.

This arrangement implements a feedback path between a current-measurement supply line used only for a pixel programming phase and the normal control line to which the pixel drive signal is provided, such that the control line voltage can be controlled in closed loop manner to achieve the desired current. The resulting control voltage can then be used for the remainder of the frame period. Thus, the desired pixel current is used as the input signal, and the actual current flowing is used as a feedback signal during the addressing phase. This enables differences in drive transistor characteristics to be tolerated. The pixel is then driven using the programmed voltage level during the remainder of the frame period. In particular, the feedback system enables a gate voltage to be determined corresponding to a desired current flow through the drive transistor.

The feedback system is preferably provided in a column driver of the display device.

Each pixel preferably further comprises an address transistor connected between the control line and the gate of the drive transistor. This is used to enable the control signal on a control line (typically a column line) to be applied to the correct pixel row. The address transistor, and the first and second switches can each be controlled by a shared control line, thereby simplifying implementation of the invention. The address transistor and the second switch are controlled synchronously, and they both form the feedback loop during the pixel programming stage, whereas the first switch is not used during programming but is used during the remainder of the frame period.

Each switch may of course comprise a transistor, and one of the switches can be an NMOS TFT and the other a PMOS TFT.

The feedback system, in the peripheral circuitry, may comprise a current-to-voltage converter section for providing a first voltage corresponding to the current drawn from the current-measurement supply line, and a comparator section for comparing the first voltage with an input voltage representing the desired current. These effectively provide measurement of the current drawn and comparison with the desired current (although converted into the voltage domain). A drive section then provides a voltage on the control line, the feedback loop being in equilibrium when the control line voltage provides drive of the drive transistor giving rise to the desired current.

The device is thus operable in two modes:

a first pixel programming mode in which a desired pixel drive current is drawn from the current-measurement supply line and the feedback system generates the corresponding gate voltage for the drive transistor, the corresponding gate-source voltage for the drive transistor being stored; and a second mode in which a current is driven through the drive transistor and the EL display element using the stored gate-source voltage.

The invention also provides a method of addressing an active matrix electroluminescent display device comprising an array of display pixels, in which each pixel comprises an electroluminescent (EL) display element and a drive transistor for driving a current through the display element, the method comprising, for each pixel:

applying a voltage to the drive transistor to drive a current through the display element, the current being drawn from a current-measurement supply line;

processing the current using feedback control circuitry outside the array of pixels and having an input representing the desired current;

generating a control voltage in the feedback control circuitry for the drive transistor using the processed current, thereby implementing a feedback control loop which reaches equilibrium when the current corresponds to the desired current, and supplying the control voltage to the pixel;

within the pixel, storing a voltage derived from the control voltage; and applying the stored voltage to the gate of the drive transistor and drawing current from a power supply line to illuminate the display element.

This method uses current feedback during pixel programming but nevertheless implements voltage-programmed pixel driving. The method provides per-pixel compensation of the drive transistor characteristics, whilst enabling the feedback control circuitry to be outside the array of pixels.

Processing the current may comprise converting the current into a voltage, and comparing the voltage with an input voltage representing the desired current to produce an amplified differential output. Current is preferably drawn from a power supply line through a first switch and current is sourced from the current-measurement supply line through a second switch, the first and second switches being operated in complimentary manner, the first switch being used after an initial pixel programming phase and the second switch being used during the initial pixel programming phase.

The invention will now be described by way of example with reference to the accompanying drawings, in which.

Figure 1:
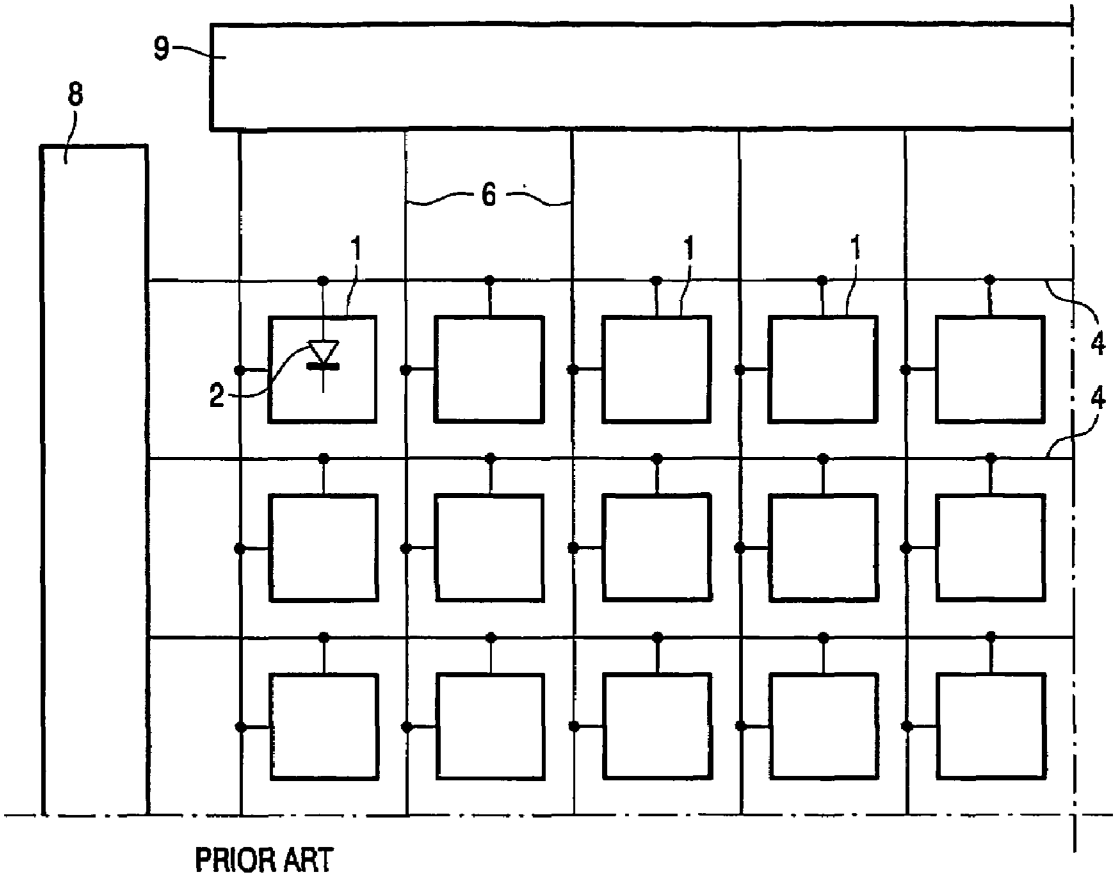
FIG. 1 shows a known EL display device.

The invention provides an active matrix electroluminescent display device in which current feedback is used during pixel programming so that any effects of differences between characteristics of the drive transistor of different pixels are avoided.

The same reference numerals are used in different figures for the same components, and description of these components will not be repeated.

Figure 2:
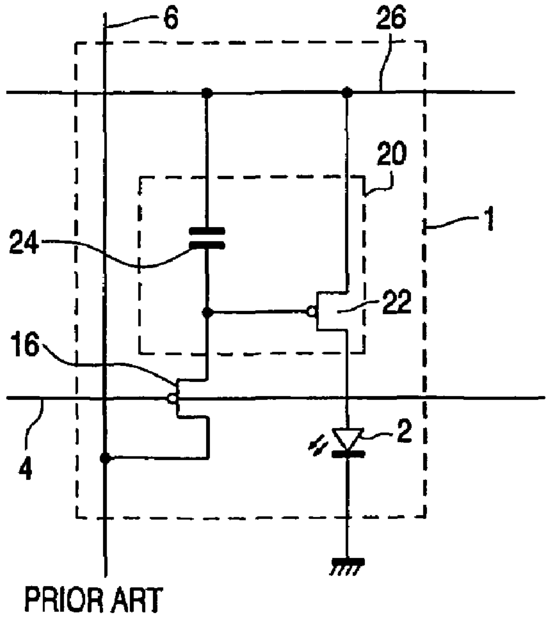
FIG. 2 is a simplified schematic diagram of a known pixel circuit using an input drive voltage.
Figure 3:
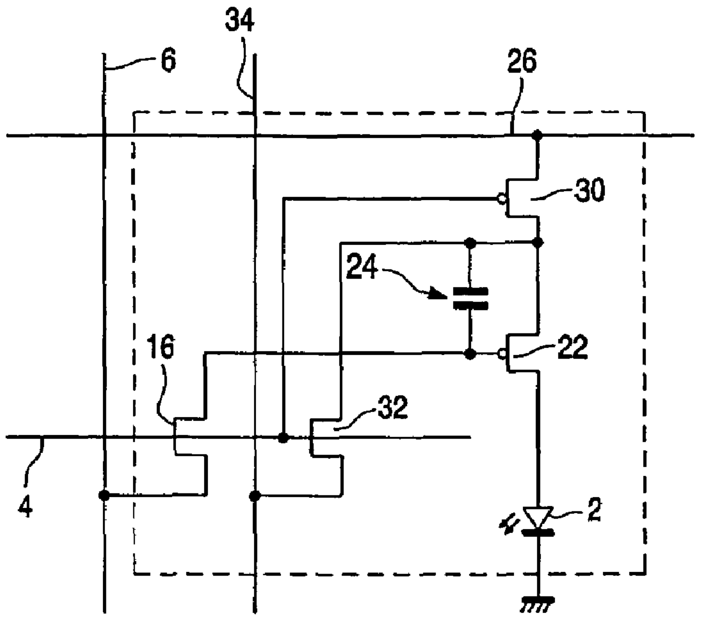
FIG. 3 shows a simplified schematic diagram of a pixel layout for a display device of the invention.

FIG. 3 shows a first pixel arrangement in accordance with the invention. As in the conventional pixel of FIG. 2, the pixel is voltage-programmed, and a storage capacitor 24 holds the voltage on the gate of the drive transistor 22 after the pixel addressing (programming) phase.

Within the pixel, two current paths are provided to the display element 2. One uses the conventional power supply line 26, but an additional transistor switch 30 is provided between the power supply line 26 and the drive transistor 22. A second transistor switch 32 provides a current path from a current-measurement supply line 34 to the drive transistor 22 and display element 2. In FIG. 3, the transistor 30 is a PMOS TFT and the second transistor switch 32 is an NMOS TFT. These are both controlled at their gates by the row conductor 4, and as a result, they are operated in complementary manner.

By switching off the transistor 30 and switching on the transistor 32, it is possible to ensure that the display element current is drawn from the current-measurement supply line 34. As this line is a column conductor, it provides current only to the individual pixel (as only one row of pixels is addressed at any one time) and it can thus operate as a current feedback circuit.

A feedback system is provided between the current-measurement supply line 34 and the control line 6. The voltage on the control line 6 is controlled in closed loop manner to achieve the desired current through the display element 2. The control voltage can then be used for subsequent driving of the display element of the pixel during the remainder of the frame period.

Figure 4:
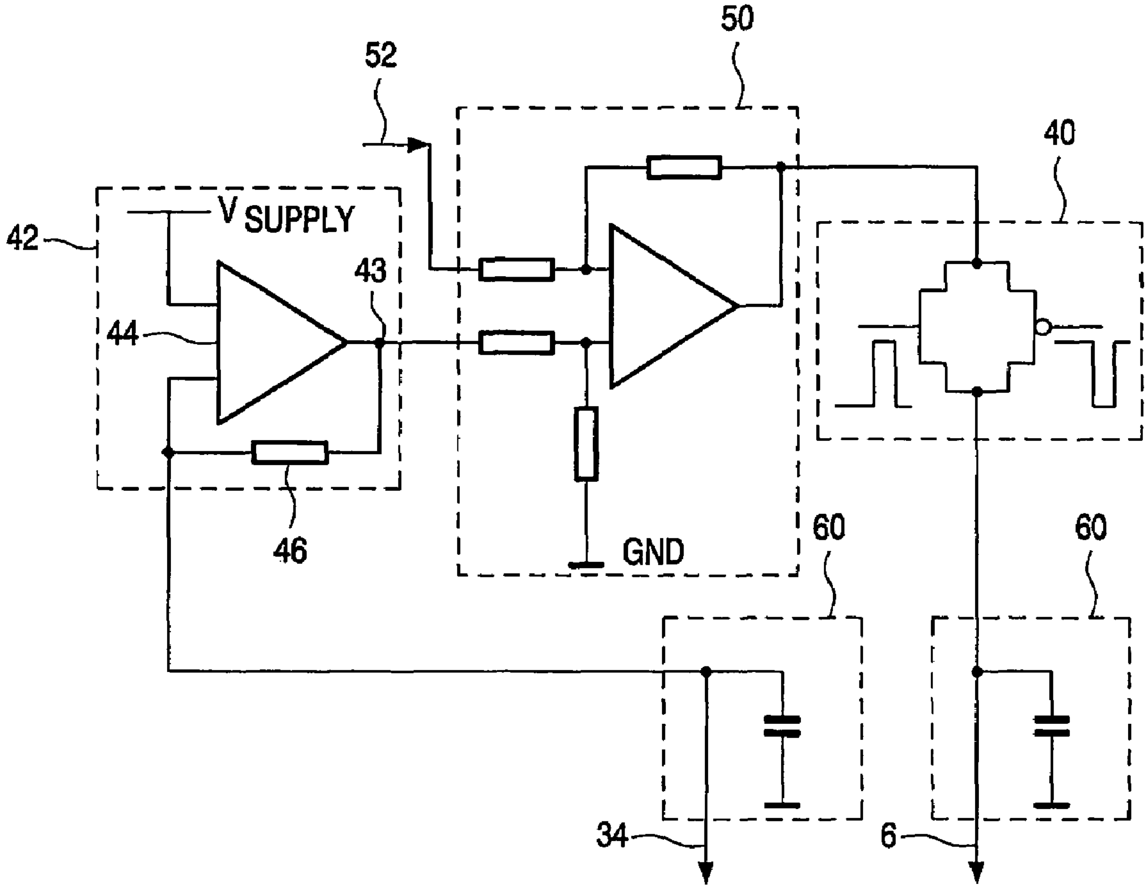
FIG. 4 shows the column driver architecture for a display using the pixel of FIG. 3.

The feedback system is provided in a column driver of the display device, and FIG. 4 shows one example of possible feedback system to be provided in the column driver.

The current-measurement supply line 34 supplies current to the pixel during the pixel programming stage, which is when the feedback system is used. During this stage, the current being drawn is effectively measured by the feedback system. The feedback system is coupled to the column conductor 6 through a transmission gate 40. With switch 32 and address transistor 16 closed, the closed loop feedback path is formed.

A current-to-voltage converter section 42 provides a voltage at node 43 dependent on the current being provided down the current-measurement supply line 34. The current-to-voltage converter section 42 has a high open loop gain amplifier 44 so that the current-measurement supply line, connected to the virtual earth amplifier input, is held at the voltage $V_{SUPPLY}$ on the other input of the amplifier 44. This is the same supply voltage as for the power supply line 26. The voltage at node 43 differs from this supply voltage by a value R×I, where R is the resistance of the feedback resistor 46 and I is the current flowing. Thus, the output voltage is a function of the current drawn from the current-measurement supply line.

A comparator section 50 compares the voltage at node 43 with an input voltage at input 52 representing the desired current. These sections 42, 50 effectively provide measurement of the current drawn and comparison with the desired current. The amplified output of the comparator section 50 is provided to the column conductor through the gate 40. The comparator section 50 thus also acts as the driver for providing the column conductor voltage.

The comparator section 50 may include an integrating amplifier at its output (not shown in FIG. 4). This can further improve the stability of the feedback loop and permit a lower gain to be employed in the amplifier of the comparator, and provide better threshold compensation in practical implementations.

The feedback loop is in equilibrium when the control line voltage on the column conductor 6 provides drive of the drive transistor 22 in the pixel giving rise to the desired current (providing the input voltage at input 52 represents the pixel current in the same way that the voltage at node 43 represents the measured current).

This operation of the feedback system is carried out during a pixel programming mode in which a desired pixel drive current is drawn from the current-measurement supply line 34 and the feedback system generates the corresponding gate voltage for the drive transistor. With reference to FIG. 3, the gate-source voltage for the drive transistor is stored on capacitor 24. This voltage is derived from the voltage provided by the feedback system on the column conductor 6.

After the pixel programming mode, the transmission gate 40 is turned off, and the row conductor 4 is operated to turn off the address transistor 16 and the transistor 32 but to turn on the transistor 30. Transistor 30 remains on during the remainder of the frame period, and until the next time the row is addressed. The source of current for the display element is then reverted to the standard power supply line 26. As well as the gate-source voltage being fixed, the potentials at the gate and source of the drive transistor remain essentially unchanged as there is the same voltage drop across the display element for the given current. Furthermore, the potential on the current-measurement supply line 34 is maintained at the power supply voltage $V_{SUPPLY}$, which corresponds to the voltage on the power supply line 26 during the pixel drive phase. The electrical environment of the drive transistor 22 is thus unchanged and the exact programmed current is maintained.

The capacitor 24 stores the gate-source voltage even if there are differences in the power supply line voltage, as these are taken up by the source-drain voltage of the transistor 30. The circuit thus compensates for drive transistor mobility variations and threshold voltage variations, and provides some resilience against supply line voltage drops.

The feedback loop is in fact broken by the transmission gate 40 just before the end of the programming phase, and the voltage on the column conductor 6 is maintained by the row parasitic capacitance 60 while the address control signal on the row conductor is changed and the different transistors in the pixel switch on and off.

A feedback circuit of FIG. 4 is preferably provided for each column, so that all columns can be addressed simultaneously, in conventional manner, with each row addressed in turn.

The PMOS and NMOS transistors can be of opposite type to those in the example above. Implementations can also be envisaged using the same type of transistor throughout, although at the expense of additional required control lines to the pixels.

The example described above uses an analogue column driver implementation. However, the pixel circuit of the invention could also be used in conjunction with a digital driver architecture. Thus, the feedback system can be implemented in a variety of ways, not only with the analogue implementation described in detail above.

In the example above, the transistor 30 for switching between the current-measuring feedback operation and the normal pixel drive operation is between the supply line 26 and the anode side of the display element 2. It could alternatively be located on the cathode-side of the display element 2 in the ground return connection.

Various other modifications will be apparent to those skilled in the art.

The invention claimed is:

1. An active matrix electroluminescent display device comprising an array of display pixels, each pixel comprising:

an electroluminescent display element and a drive transistor for driving a current through the display element;

a first switch enabling power from a power supply line to be supplied to the display element;

a second switch for routing current from a current-measurement supply line to the display element, the first and second switches being operated in complementary manner;

a control line for controlling the gate voltage applied to the drive transistor, and an address transistor connected between the control line and the gate of the drive transistor wherein a feedback system is provided between the current-measurement supply line and the control line.

2. The device of claim 1, wherein the feedback system enables a gate voltage to be determined corresponding to a desired current flow through the drive transistor.

3. The device of claim 1 or 2, wherein the feedback system is provided in a column driver of the display device.

4. The device of claim 1, wherein each pixel further comprises a storage capacitor for storing a gate-source voltage of the drive transistor.

5. The device of claim 1, wherein the address transistor, and the first and second switches are each controlled by a shared control line.

6. The device of claim 5, wherein the address transistor and the second switch are controlled synchronously.

7. The device of claim 1, wherein each switch comprises a transistor.

8. The device of claim 7, wherein one of the switches is an NMOS TFT and the other is a PMOS TFT.

9. The device of claim 1, wherein the feedback system comprises:

a current-to-voltage converter section for providing a first voltage corresponding to the current drawn from the current-measurement supply line;

a comparator section for comparing the first voltage with an input voltage representing the desired current; and a drive section for providing a voltage on the control line, the feedback loop being in equilibrium when the control line voltage provides drive of the drive transistor giving rise to a current corresponding to the input voltage.

10. The device of claim 1, wherein the device is operable in two modes:

a first mode in which a desired pixel drive current is drawn from the current-measurement supply line and the feedback system generates the corresponding gate voltage for the drive transistor, the corresponding gate-source voltage for the drive transistor being stored; and a second mode in which a current is driven through the drive transistor and the EL display element using the stored gate-source voltage.

* * * * *